United States Patent
Bao

(10) Patent No.: US 9,841,445 B2
(45) Date of Patent: Dec. 12, 2017

(54) POWER DETECTOR

(71) Applicant: Telefonaktiebolaget LM Ericsson (publ), Stockholm (SE)

(72) Inventor: Mingquan Bao, Västra Frölunda (SE)

(73) Assignee: TELEFONAKTIEBOLAGET LM ERICSSON (PUBL), Stockholm (SE)

(*) Notice: Subject to any disclaimer, the term of this patent is extended or adjusted under 35 U.S.C. 154(b) by 0 days.

(21) Appl. No.: 15/104,704

(22) PCT Filed: Dec. 16, 2013

(86) PCT No.: PCT/EP2013/076777
§ 371 (c)(1),
(2) Date: Jun. 15, 2016

(87) PCT Pub. No.: WO2015/090357
PCT Pub. Date: Jun. 25, 2015

(65) Prior Publication Data
US 2017/0016941 A1    Jan. 19, 2017

(51) Int. Cl.
*G01R 21/10*    (2006.01)

(52) U.S. Cl.
CPC ..................... *G01R 21/10* (2013.01)

(58) Field of Classification Search
CPC ........ G01R 21/10; G01R 21/12; G01R 21/01; G01R 15/09; G01R 19/02
See application file for complete search history.

(56) References Cited

U.S. PATENT DOCUMENTS 8,581,574 B2 * 11/2013 Eken ...................... G01R 21/12
                                                              324/140 R

FOREIGN PATENT DOCUMENTS

| EP | 1870716 A1 | 12/2007 |
| WO | 2011063328 A2 | 5/2011 |

OTHER PUBLICATIONS

Bao, Mingquan et al., "A Single-Chip 15 to 30 GHz Six-port Demodulator for Multi-Gb/s Communication", 2012 IEEE MTT-S International Microwave Symposium Digest (MTT), Montreal, Canada, Jun. 17-22, 2012, 1-3.

* cited by examiner

*Primary Examiner* — Minh N Tang
(74) *Attorney, Agent, or Firm* — Murphy, Bilak & Homiller, PLLC

(57) ABSTRACT

A power detector comprising a first and a second bipolar junction/FET transistor. The first transistor is arranged as a common base/gate transistor with its base/gate being biased by a bias voltage and the second transistor is arranged as a common emitter/source transistor with its emitter/source being grounded. The power detector also comprises a diode or current source connected to ground from the emitter/source of the first transistor, in which power detector an input port is connected to the emitter of the first transistor and to the base/gate of the second transistor, and an output port is connected to the collectors/drains of the first and second transistor, said collectors/drains also being connected to a DC supply via a first resistor.

3 Claims, 14 Drawing Sheets

POWER DETECTOR

TECHNICAL FIELD

The present invention discloses a novel power detector.

BACKGROUND

Power detectors are circuits which are useful in a wide variety of applications, e.g. in receivers in wireless communications systems, in radar systems or in TV sets.

With the increase in data speeds, the demands for lower response times for power detectors also increase. Conventional power detectors which usually comprise a transistor or a diode, together with a low pass filter, are usually unable to provide the desired fast response times, especially with a stable output signal.

Another kind of power detector which has been proposed in order to deliver fast response times is a differential or mixer based power detector. However, such power detectors require the use of a balun which usually comprises reactive components, such as, for example, coupled transmission lines. Such reactive components may degrade the response times, and may also cause distortions of the output signal and limit the power detector's frequency bandwidth.

SUMMARY

It is an object to provide a power detector which obviates at least some of the disadvantages of previously available power detectors.

This object is obtained by means of a power detector which comprises a first and a second bipolar junction/FET transistor. The first transistor is arranged as a common base/gate transistor with its base/gate being biased by a bias voltage and the second transistor is arranged as a common emitter/source transistor with its emitter/source being grounded.

The power detector also comprises a diode or a current source connected to ground from the emitter/source of the first transistor and in the power detector an input port is connected to the emitter/source of the first transistor and to the base/gate of the second transistor. An output port is connected to the collectors/drains of the first and second transistor, with the collectors/drains also being connected to a DC supply via a first resistor.

In some embodiments which use a diode, the diode comprises a third transistor connected so as to function as a diode, by means of the base/gate of the third transistor being connected to the collector/drain of the third transistor. In addition, the third transistor's emitter/source is connected to ground, its collector/drain is connected to the emitter/source of the first transistor, and the base/gate of the third transistor is connected to the base/gate of the second transistor.

In embodiments, the power detector additionally comprises a fourth bipolar junction/FET transistor, arranged with said output port and said first resistor connected to its collector/drain and its emitter/source to the collectors/drains of the first and second transistors, with its base/gate subjected to a bias voltage via a second resistor.

BRIEF DESCRIPTION OF THE DRAWINGS

The invention will be described in more detail in the following, with reference to the appended drawings, in which.

DETAILED DESCRIPTION

Figure 1:
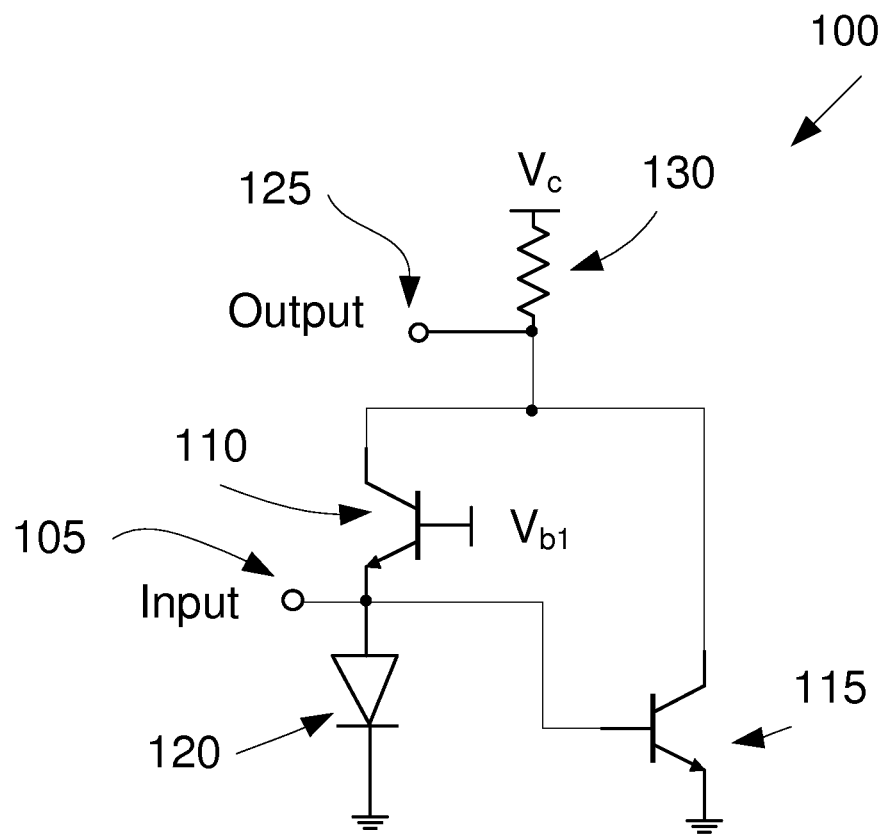
FIG. 1 shows a first embodiment of a power detector.

Embodiments of the present invention will be described more fully hereinafter with reference to the accompanying drawings, in which embodiments of the invention are shown. The invention may, however, be embodied in many different forms and should not be construed as being limited to the embodiments set forth herein. Like numbers in the drawings refer to like elements throughout.

The terminology used herein is for the purpose of describing particular embodiments only, and is not intended to limit the invention.

FIG. 1 shows a first embodiment of a power detector 100. 1. As shown in FIG. 1, the power detector 100 comprises a first 110 and a second 115 bipolar junction transistor. The first transistor 110 is arranged as a common base transistor biased by a bias voltage $V_{b1}$ at its base, and the second transistor 115 is arranged as a common emitter transistor, with its emitter being grounded.

The notions of common base and common emitter transistors are well defined in the art, but can be described as follows: In a common base transistor, the emitter of the transistor serves as the input terminal, the collector serves as the output terminal and the base is connected to ground, directly or indirectly.

In a common emitter transistor, the base of the transistor serves as the input terminal, the collector is the output terminal, and the emitter is common, e.g. by virtue of being connected to ground, directly or indirectly.

The power detector 100 comprises a, diode 120, which serves as a DC path to ground from the emitter of the first transistor 110 by means of being connected as follows: the emitter of the first transistor 110 is connected to the anode of the diode 120, and the cathode of the diode 120 should be grounded. In addition, the base of the second transistor 115 is connected to the anode of the diode.

The power detector 100 has an input port 105 connected to the emitter of the first transistor 110 and to the base of the second transistor 115, and thereby also to the anode of the diode 120.

The power detector 100 has an output port 125 which is connected to the collectors of the first 110 and second 115 transistor, with these collectors in this embodiment being connected to each other as well. These collectors are also connected to a DC supply $V_c$ via a first resistor 130.

Figure 2:
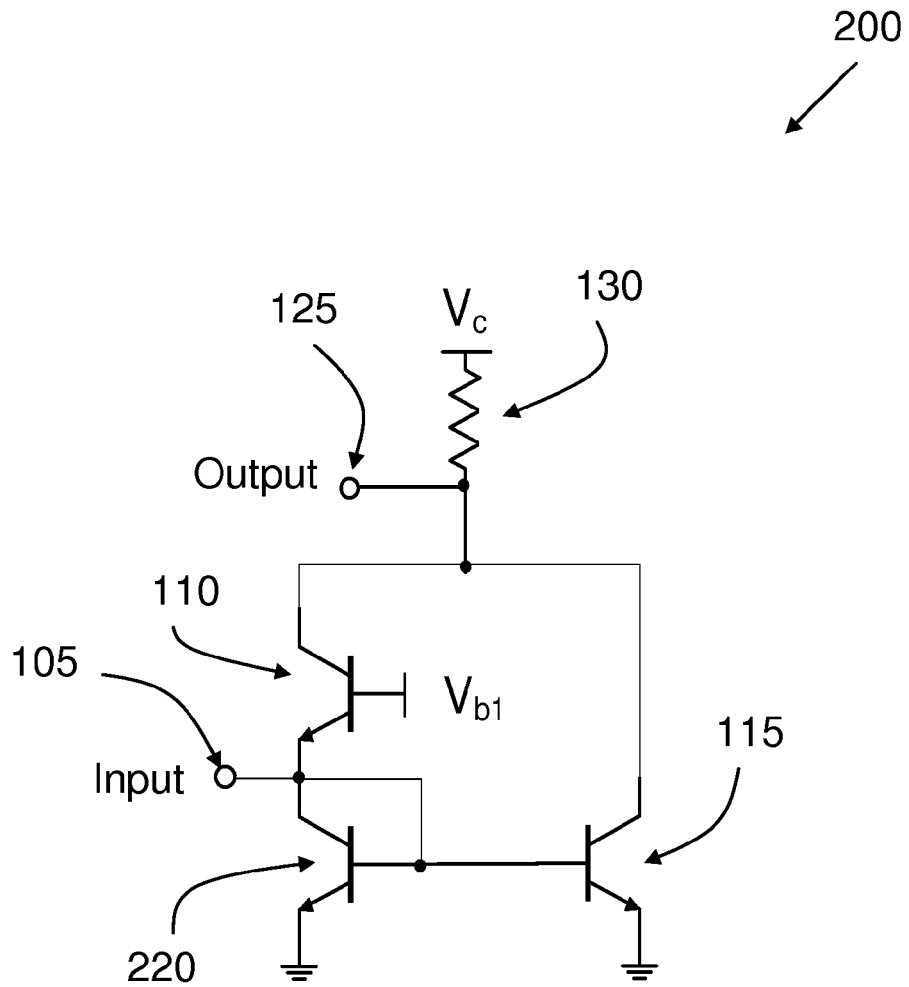
FIG. 2 shows a second embodiment of a power detector.

In a second embodiment 200, shown in FIG. 2, a third transistor 220 is used instead of the diode 120, with the third transistor being connected so as to have the function of a diode, which is accomplished by means of the base of the third transistor 220 being connected to the collector of the third transistor 220. The diode which is formed in this way is then connected as follows in order to obtain the function of the diode of FIG. 1: the third transistor's emitter is connected to ground and its collector is connected to the emitter of the first transistor 110. As shown in FIG. 2, in the embodiment 200, the bases of the third and second transistors 120 and 115 are also connected to each other, which equals the connection of the base of the second transistor 115 to the anode of the diode 110, as shown in FIG. 1.

As shown in FIG. 2, in this embodiment, the input port 105 is connected to the anode of the diode formed by the third transistor 220 by means of being connected to the collector of the transistor 220, and thereby also to its base. The other connections exhibited by the input port 105 in the embodiment 100 of FIG. 1 are present in the embodiment 200 as well: in the embodiment 200, in similarity to the embodiment 100 of FIG. 1, the power detector 200 has the input port 105 connected to the emitter of the first transistor 110 and to the base of the second transistor 115.

In the power detector 200, the output port 125 is connected to the collectors of the first 110 and second 115 transistor, with these collectors in this embodiment being connected to each other as well. These collectors are also connected to a control voltage $V_c$ via the first resistor 130.

The function of the embodiments 100 and 200 is as follows: Input signals are applied at the input port 105, and thereby to the base of the second transistor 115 and the emitter of the first 110 transistor simultaneously. Due to the inherent nonlinearity of a transistor as a component, the output signals of the second 115 and first 110 transistors will contain DC components as well as harmonics of the input signal, i.e. signals at frequencies which are multiples of the frequency of the input signal.

The $1^{st}$ harmonics in the output signals of the second 115 and first 110 transistors have a 180 phase difference between them, since the second transistor 115 is configured as a common emitter transistor, and the first transistor 110 is configured as a common base transistor. Thus, by connecting the output terminals (i.e. the collectors) of the second 115 and first 110 transistors as is done in the embodiments 100 and 200, the $1^{st}$ harmonics generated by $Q_2$ and $Q_3$ will be cancelled, given that they have the same amplitude; otherwise, the $1^{st}$ harmonic will "merely" be suppressed. This cancellation/suppression of the $1^{st}$ harmonic is a desired feature for a power detector, since all harmonics create a ripple in the output signal of a power detector, and the $1^{st}$ harmonic has the "heaviest" contribution to this output ripple.

Figure 3:
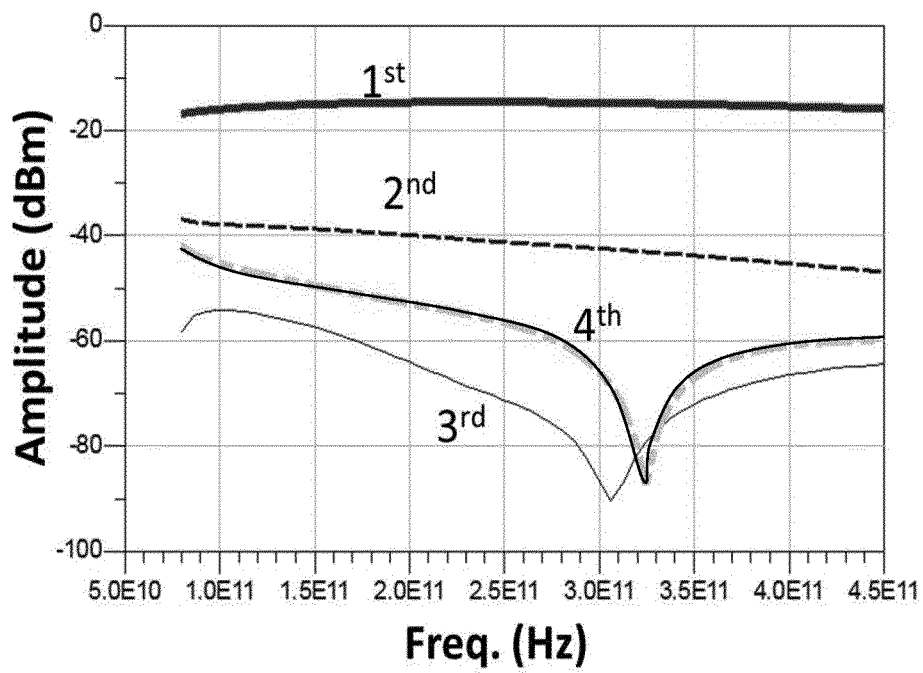
FIG. 3 shows output harmonics of the power detector of FIG. 2 as a function of un-modulated RF-signals.

An example of the amplitude of the harmonics in the output signal from the power detector 200, i.e. the signal at the output port 125 when a signal is applied to the input port 105, is shown in FIG. 3: in this example, the input signal is a non-modulated sine wave with a power level of 0 dBm and a frequency which is swept from 80 GHz to 450 GHz. FIG. 3 shows the amplitude of the $1^{st}$, the $2^{nd}$, the $3^{rd}$, and the $4^{th}$ harmonics as a function of frequency, and as seen, even though the $1^{st}$ harmonic is the major harmonic, its amplitude is less than −17 dBm, while the amplitude of the $2^{nd}$ harmonic is less than −38 dBm, and the $3^{rd}$ and $4^{th}$ harmonics are even lower.

Figure 4:
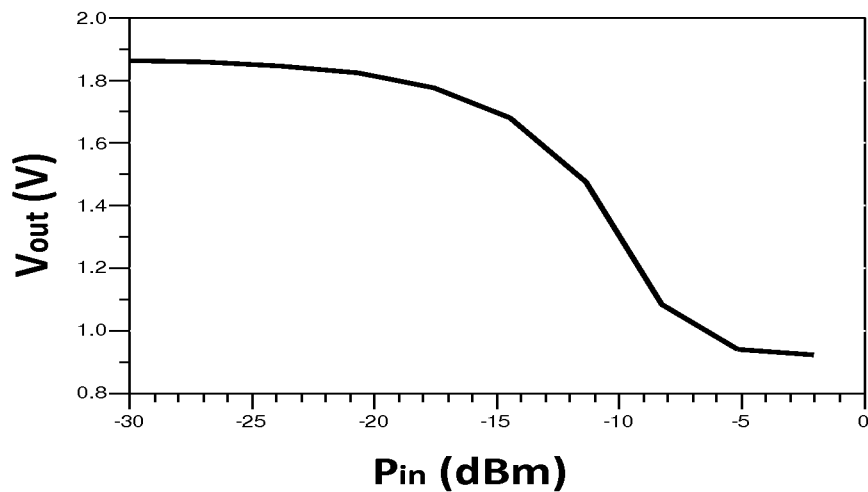
FIG. 4 shows the DC output as a function of RF input power for the power detector of FIG. 2.

In FIG. 4, the output signal (DC component only) of the power detector 200 as a function of input power is shown for an un-modulated input signal, i.e. a sine signal, at a frequency of 150 GHz. We can see that as the input power increases from 30 dBm to −2 dBm, the output voltage drops approximately 0.94V.

The transient response of the power detector 200 of FIG. 2 to an input signal which is a modulated RF signal will now be discussed, with reference to FIGS. 5a and 5b. The input RF signal which is used as an example here is on-off modulated, with a carrier which has a frequency of 150 GHz and a power level of 0 dBm. The on-off data is a period pulse series with a 50% duty cycle, and the pulse duration, $T_d$, is 50 ps, and the data rate ($1/T_d$) is 20 Gbps. The time-domain of the input signal is shown in FIG. 4a. The peak-to-peak voltage, $V_{p-p}$, of the input signal is 334 mV. The time-domain output which the power detector 200 of FIG. 2 generates for this input signal is shown in FIG. 5b. The peak-to-peak voltage of the output is 190 mV, and a ripple exists in the output signal, with an amplitude of 79 mV. The amplitude of the ripple in the output signal is 41% of the peak-to-peak voltage $V_{p-p}$ of the output signal.

Figure 5A:
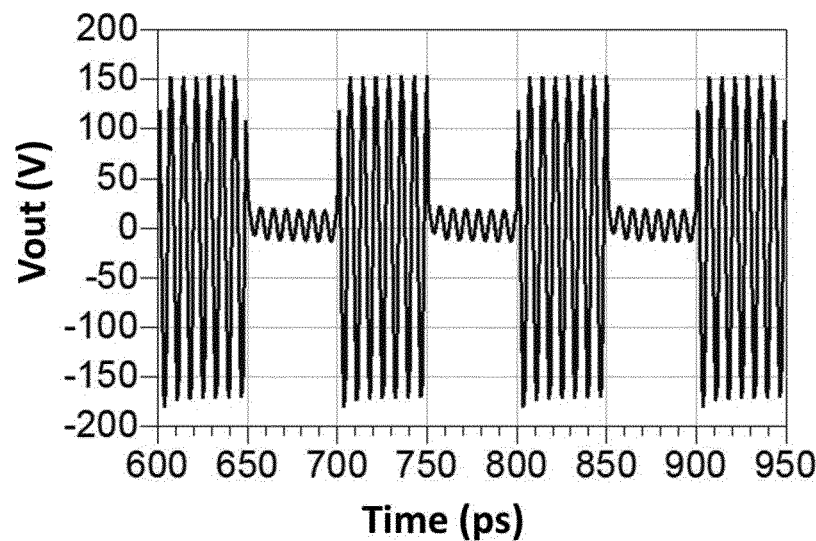
FIG. 5a shows a modulated RF input signal at a data rate of 20 Gbps at a carrier frequency of 150 GHZ.
Figure 5B:
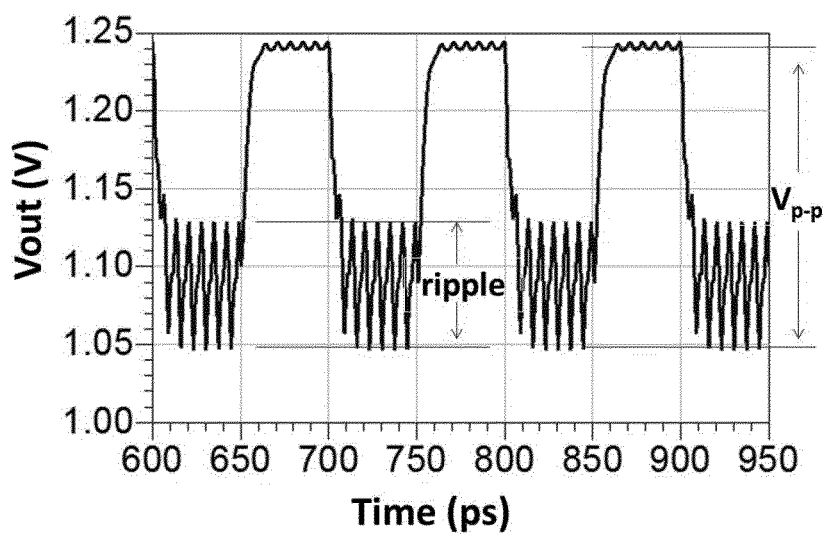
FIG. 5b shows the corresponding output signal for the power detector of FIG. 2.

As we can see in FIGS. 5a and 5b, in the "on" state of the input signal, e.g., from 600 ps to 650 ps, the power detector 200 has a low-level output, since the output of the power detector 200 is inversely propositional to the input power, as was shown in FIG. 4. As the amplitude of the modulated input signal increases, the amplitude of the output voltage decreases. In the "off" state, e.g. from 650 ps to 700 ps, the power detector 200 has a high-level output signal.

Figure 6:
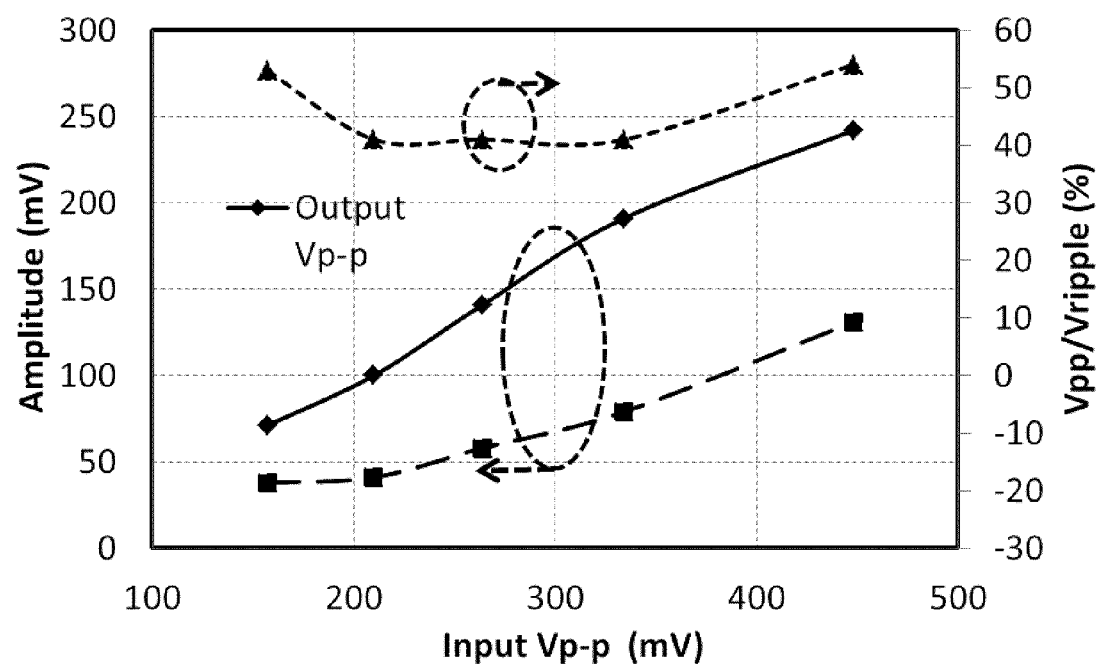
FIG. 6 shows various characteristics of the power detector of FIG. 2 for an input RF signal with a data rate of 20 Gbps and a carrier frequency of 150 GHz.

For the case in which the input signal to the power detector 200 has a carrier frequency of 150 GHz and a data rate of 20 Gbps, FIG. 6 shows the peak-to-peak voltage, $V_{pp}$ of the output signal, the amplitude of the output ripple, as well as the ratio of the amplitude of the ripple and output $V_{pp}$ as a function of the $V_{pp}$ of the input signal. It can be seen that the $V_{pp}$ of the output signal increases almost linearly with $V_{pp}$ of the input signal. Consequently, we can see that the peak-to-peak voltage of the output signal is proportional to the peak-to-peak voltage of the input signal.

Figure 7A:
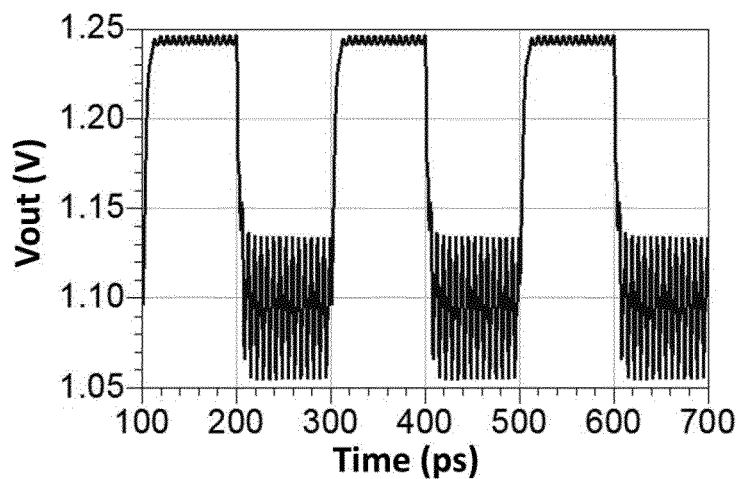
FIGS. 7a and 7b show the output signal from the power detector of FIG. 2 for an input RF signal with a data rate of 10 Gbps and 40 Gpbs, respectively.
Figure 7B:
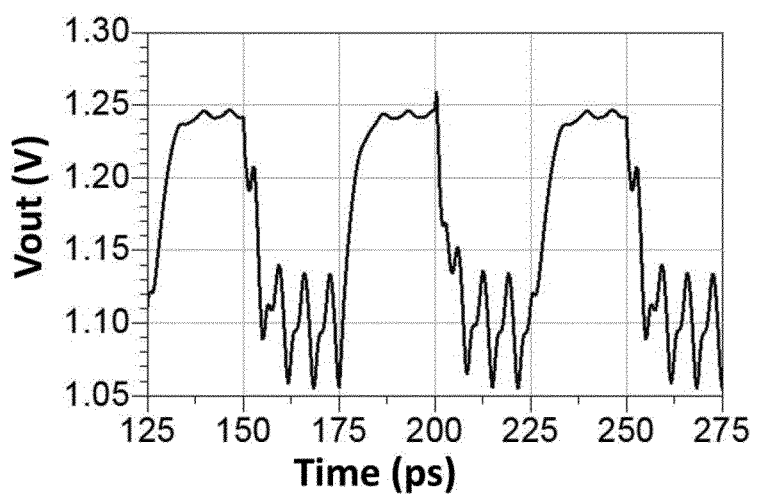

FIGS. 7a and 7b show the output signal for an input signal with a date rate of 10 Gbps (FIG. 7a) and 40 Gbps (FIG. 7b), for a fixed carrier frequency of 150 GHz and a power level of 0 dBm. It can be seen that the output signal is somewhat distorted as the data rate is increased up to 40 Gbps, but that the $V_{pp}$ and the amplitude of the ripple of the output signal remain almost unchanged as the data rate is increased from 10 Gbps to 40 Gbps.

Figure 8:
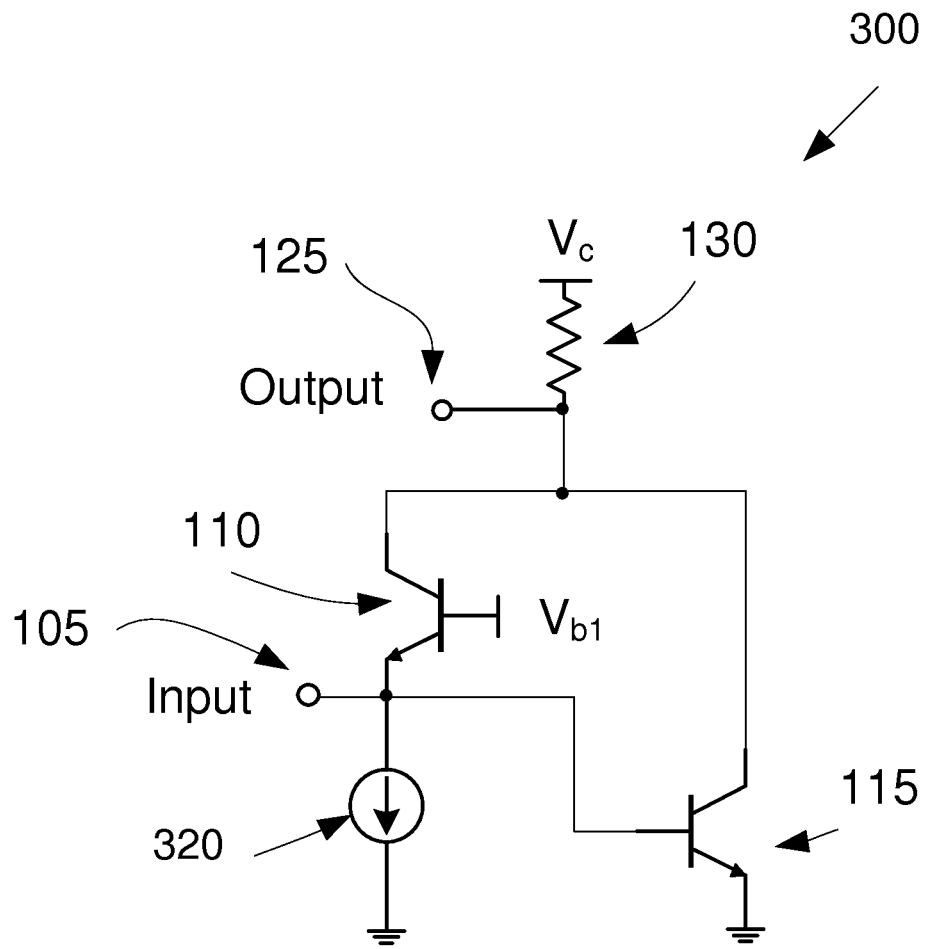
FIG. 8 shows a third embodiment of a power detector.

As has been pointed out previously in this text, the DC path from the first transistor 110 to ground can comprise either an ordinary diode or a bipolar junction transistor connected so as to constitute a diode from the first transistor 110 to ground. In a further embodiment 300, which is shown in FIG. 8, the DC path can instead comprise a current source 320, with the emitter of the first transistor 110 and the base of the second transistor 115 being connected to one end of the current source and the other end of the current source being connected to ground. The current source 320 is thus connected so as to form a DC path from the first transistor 110 to ground.

Figure 9:
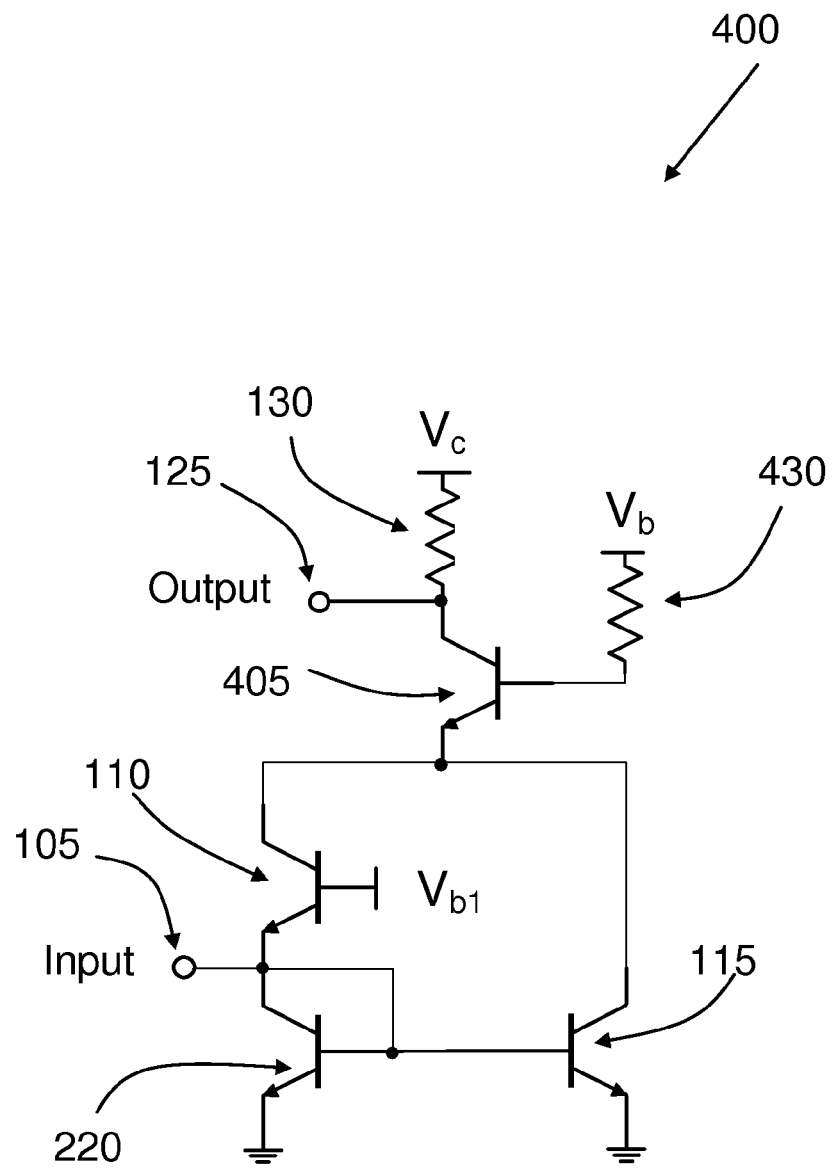
FIG. 9 shows a fourth embodiment of a power detector.

FIG. 9 shows a further embodiment 400 of a power detector. In FIG. 9, components which have been shown in FIGS. 1, 2 and 8 have retained their reference numbers. A difference between the embodiment 400 and the embodiments 100, 200 and 300 is that the embodiment 400 comprises a fourth bipolar junction transistor 405. As shown in FIG. 9, the base of the fourth transistor 405 is biased with a bias voltage $V_b$ through a second resistor 430. As is also shown in FIG. 9, the collector of the fourth transistor 405 is connected to the output port 125 and to the DC supply $V_c$ through the resistor 130, and the emitter of the fourth transistor 405 is connected to the collectors of the first and second transistors 110, 115. In other words, it could be said that the fourth transistor 405 is connected between the collectors of the first and second transistors 110, 115 and the output port 125, as compared to the embodiments 100, 200 and 300.

Figure 10:
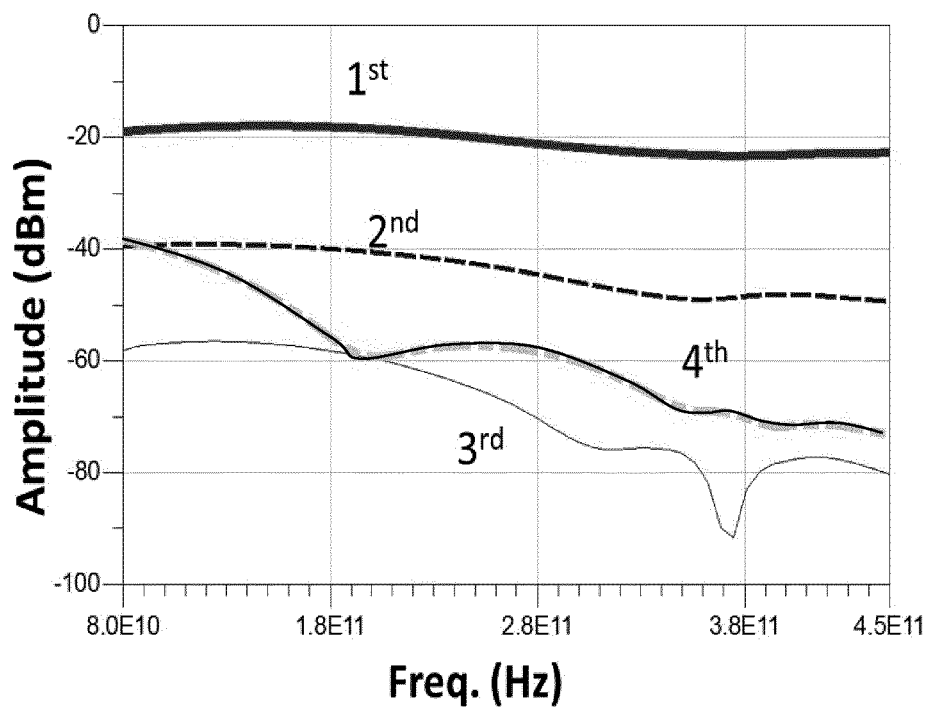
FIG. 10 shows output harmonics of the power detector of FIG. 9 as a function of un-modulated RF-signals.

FIG. 10 shows the amplitudes of the $1^{st}$, the $2^{nd}$, the $3^{rd}$, and the $4^{th}$ order harmonics in the output signal of the power detector 400 of FIG. 9 for a un-modulated input RF signal with power of 0 dBm. The amplitude of the $1^{st}$ harmonic is around −20 dBm, which is 2~8 dB lower than that of the power detectors 100 and 200 in the frequency range from 80 GHz to 450 GHz; consequently, the amplitude of the ripple in the output signal will be reduced.

Figure 11:
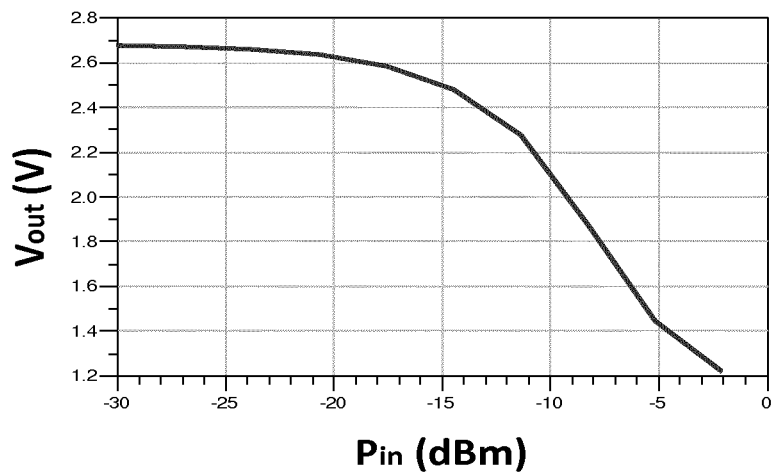
FIG. 11 shows the DC output as a function of RF input power for the power detector of FIG. 9.

FIG. 11 shows the output DC signal of the power detector 400 for a un-modulated input RF signal at a frequency of 150 GHz. As seen in FIG. 11, as the input power increases from −30 dBm to −2 dBm, the output DC voltage changes approximately 1.5V.

Figure 12A:
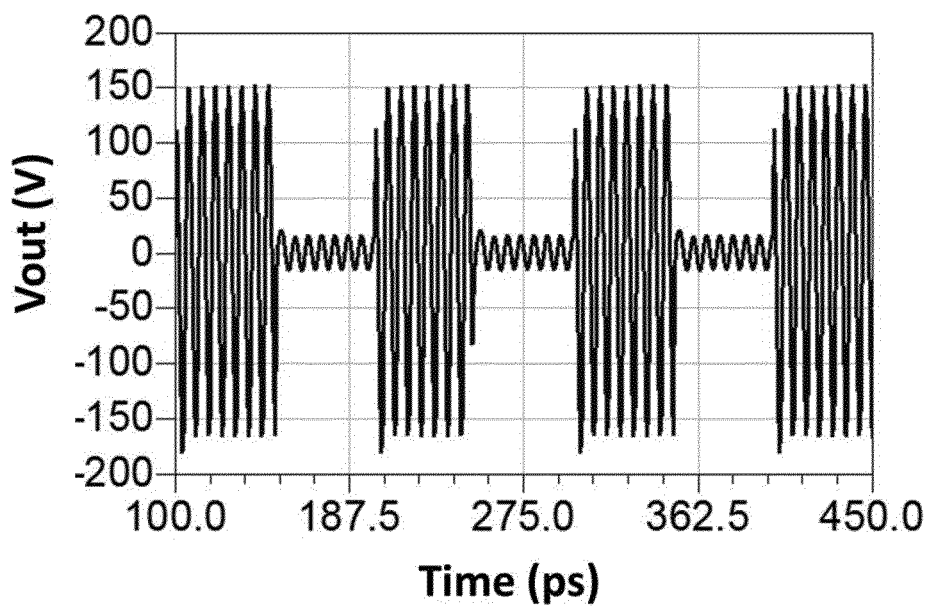
FIG. 12a shows a modulated RF input signal at a data rate of 20 Gbps at a carrier frequency of 150 GHZ.
Figure 12B:
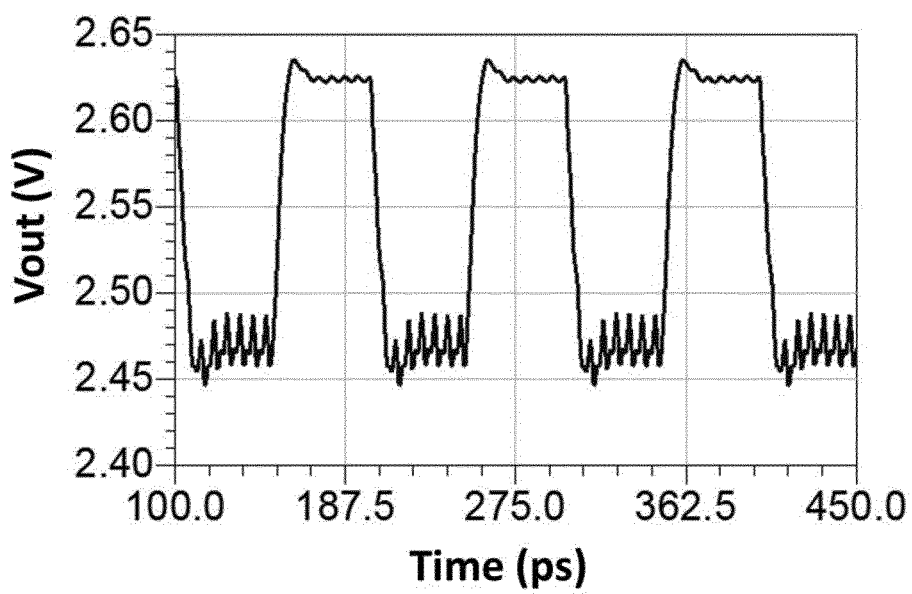
FIG. 12b shows the corresponding output signal for the power detector of FIG. 9.

FIG. 12a shows an input signal to the power detector 400 of FIG. 9, said input signal being a modulated RF signal at a data rate of 20 Gbps over a carrier frequency of 150 GHz, with a power of 0 dBm, and FIG. 12b shows the corresponding output signal. It can be seen that the peak-to-peak voltage of the input and the output signals are 323 mV and 190 mV, respectively. The amplitude of the ripple is 43 mV, which is about a half of that of the power detector 200.

Figure 13:
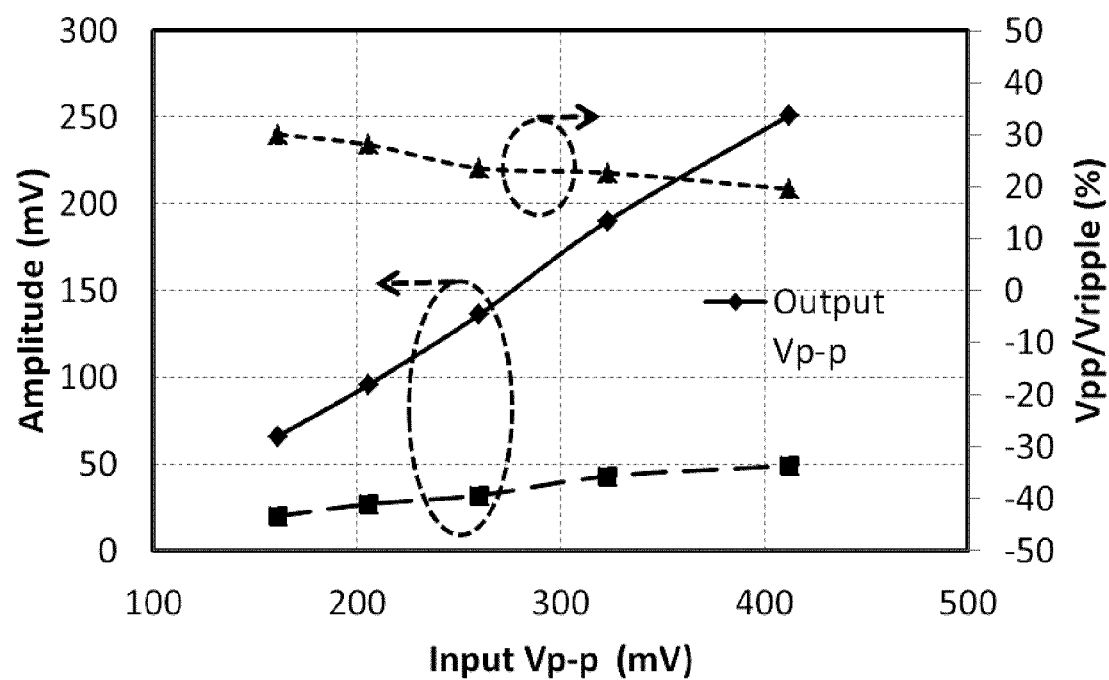
FIG. 13 shows various characteristics of the power detector of FIG. 9 for an input RF signal with a data rate of 20 Gbps and a carrier frequency of 150 GHz.

FIG. 13 shows the corresponding characteristics for the power detector 400 as FIG. 6 did for the power detector 200, i.e. FIG. 13 shows how, the input peak-to-peak voltage is changed, the output peak-to-peak voltage, and the amplitude of the ripple, as well as the ratio of the amplitude of the ripple and output peak-to-peak voltage vary. As can be seen, the output peak-to-peak voltage is linear proportional to the input peak-to-peak voltage, and it can also be seen that the amplitude of the ripple is reduced compared with the power detector 200. In the power detector 400, the ratio of the amplitude of the ripple and the output peak-to-peak voltage is about 20%-30%.

Figure 14A:
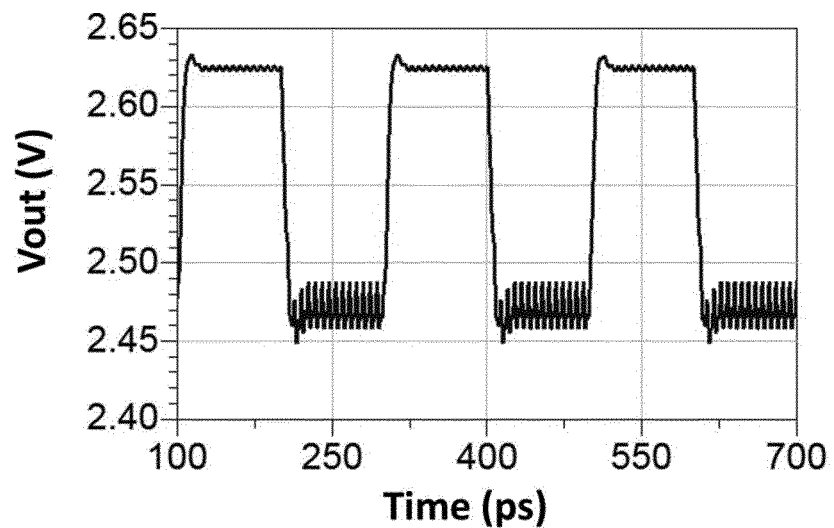
FIGS. 14a and 14b show the output waveform for the power detector of FIG. 9 for an input signal with a data rate of 10 Gbps and 40 Gbps, respectively, at a carrier frequency of 150 GHz.
Figure 14B:
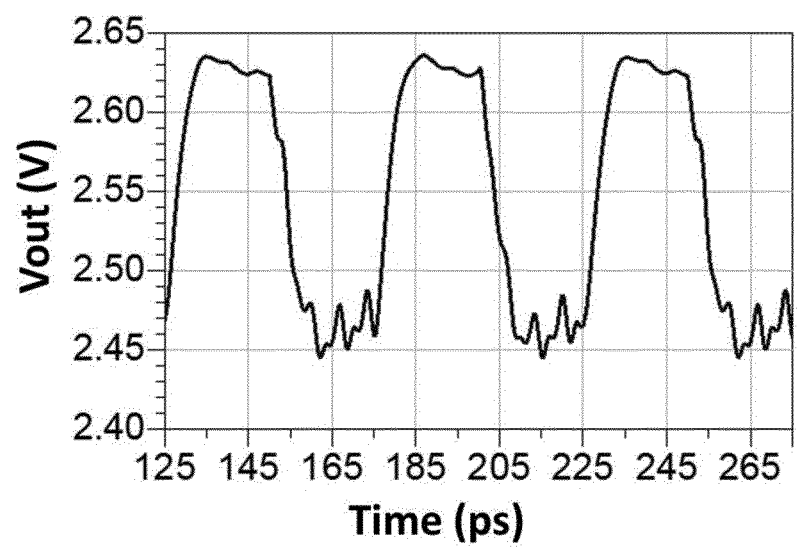

FIGS. 14a and 14b show the output signals for an input data rate of 10 Gbps (FIG. 14a) and 40 Gbp (FIG. 14b) with a fixed carrier frequency of 150 GHz and a power level of 0 dBm. As seen in FIG. 14b, even though the output waveform is distorted slightly when the date rate is 40 Gbps, the peak-to-peak voltage and the amplitude of the ripple do not change, compared with the output waveform at an input data rate of 10 Gbps. This indicates that the power detector 400 of FIG. 9 is able to process high date rate signals with results that are even better than those of the power detector 200.

Throughout in the text above as well as in the drawings, the transistors in the power detectors have been shown and described as bipolar junction transistors. As those skilled in the art will realize, other kinds of transistors can also be used, for example Field Effect Transistors, FETs. If such a substitution is made, the transistor terminals in the description above, as well as in the drawings, should be substituted as follows:

| Bipolar junction transistor | FET |
|---|---|
| Base | Gate |
| Collector | Drain |
| Emitter | Source |
| Common base configuration | Common gate configuration |
| Common emitter configuration | Common source configuration |

In the drawings and specification, there have been disclosed exemplary embodiments of the invention. However, many variations and modifications can be made to these embodiments without substantially departing from the principles of the present invention. Accordingly, although specific terms are employed, they are used in a generic and descriptive sense only and not for purposes of limitation.

The invention is not limited to the examples of embodiments described above and shown in the drawings, but may be freely varied within the scope of the appended claims.

The invention claimed is:

1. A power detector comprising:
   a first transistor, said first transistor being a bipolar junction transistor having a base, emitter, and collector, or being a field-effect transistor (FET) having a gate, source, and drain, and wherein said first transistor is arranged as a common base or gate transistor with the base or gate of the first transistor being biased by a bias voltage;
   a second transistor, said second transistor being a bipolar junction transistor having a base, emitter, and collector, or being a FET having a gate, source, and drain, and wherein said second transistor is arranged as a common emitter or source transistor with the emitter or source of the second transistor being grounded;
   at least one of a diode and a current source, connected to ground from the emitter or source of the first transistor;
   an input port connected to the emitter or source of the first transistor and to the base or gate of the second transistor; and
   an output port connected to the collector or drain of each of the first and second transistors, the collector or drain of each of the first and second transistors also being connected to a DC supply via a first resistor.

2. The power detector of claim 1, wherein the diode comprises a third transistor, said third transistor having a base or gate, a collector or drain, and an emitter or source, and said third transistor connected so as to function as a diode, by means of the base or gate of the third transistor being connected to the collector or drain of the third transistor, and wherein the emitter or source of the third transistor is connected to ground, the collector or drain of the third transistor is connected to the emitter or source of the first transistor, and the base or gate of the third transistor is connected to the base or gate of the second transistor.

3. The power detector of claim 1, further comprising a third transistor, said third transistor being a bipolar junction transistor having a base, emitter, and collector, or being a FET having a gate, source, and drain, wherein the third transistor is arranged with said output port and said first resistor connected to the collector or drain of the third transistor, wherein the emitter or source of the third transistor is connected to the collector or drain of each of the first and second transistors, and wherein the base or gate of the third transistor is subjected to a bias voltage via a second resistor.

* * * * *